(12) United States Patent
Suzuki et al.

(10) Patent No.: US 7,473,380 B2
(45) Date of Patent: Jan. 6, 2009

(54) ETCHING LIQUID

(75) Inventors: Yoshihide Suzuki, Osaka (JP); Keiichi Sawai, Osaka (JP); Noriyuki Saitou, Fukuoka (JP); Masaru Miyoshi, Fukuoka (JP); Makoto Ishikawa, Fukuoka (JP)

(73) Assignees: Sharp Kabushiki Kaisha, Osaka-Shi (JP); Mitsubishi Chemical Corporation, Tokyo (JP)

( * ) Notice: Subject to any disclaimer, the term of this patent is extended or adjusted under 35 U.S.C. 154(b) by 525 days.

(21) Appl. No.: 10/301,653

(22) Filed: Nov. 22, 2002

(65) Prior Publication Data

US 2003/0100191 A1 May 29, 2003

(30) Foreign Application Priority Data

Nov. 28, 2001 (JP) ............................. 2001-362899
Oct. 21, 2002 (JP) ............................. 2002-306001

(51) Int. Cl.
*C09K 13/00* (2006.01)
*C09K 13/06* (2006.01)
*H01L 21/302* (2006.01)

(52) U.S. Cl. ..................... 252/79.1; 252/79.4; 438/745

(58) Field of Classification Search ................ 252/79.1, 252/79.4, 79.2; 438/745
See application file for complete search history.

(56) References Cited

U.S. PATENT DOCUMENTS

| | | | | |
|---|---|---|---|---|
| 3,801,880 A | * | 4/1974 | Harada et al. ............... | 257/752 |
| 4,375,984 A | * | 3/1983 | Bahl et al. .................. | 75/715 |
| 4,822,754 A | * | 4/1989 | Lynch et al. ................. | 438/586 |
| 6,030,883 A | * | 2/2000 | Nishimoto et al. .......... | 438/455 |
| 6,103,540 A | * | 8/2000 | Russell et al. ................ | 438/22 |
| 6,248,655 B1 | * | 6/2001 | Machida et al. ............. | 438/597 |

FOREIGN PATENT DOCUMENTS

| | | | |
|---|---|---|---|
| JP | S45-24887 | | 8/1970 |
| JP | 49-123132 | | 11/1974 |
| JP | 49123132 A | * | 11/1974 |
| JP | S49-123132 | | 11/1974 |
| JP | 51-20976 | | 6/1976 |
| JP | 57174462 A | * | 5/1983 |
| JP | S61-044186 | | 3/1986 |
| JP | 61127874 | | 6/1986 |
| JP | 63-17683 | | 7/1988 |
| JP | 6-333911 | | 12/1994 |
| JP | 7307550 | | 11/1995 |
| JP | 2002-190458 | | 8/2002 |

OTHER PUBLICATIONS

Hitachi Ltd,. Etching of gold, palladium and their alloy—with iodine contg. scans with subseq. soaking in iodine solubilizing liquid, Nov. 25, 1974, English Abstract of JP 49123132 A, 1 page.*

Bleeks et al., Selective removal of nickel alloys from metal substrates—using conc. nitric acid soln. contg. chloride ions, organic corrosion inhibitor e.g. amine and opt. surfactant, English Abstract of JP 57174462 A, 2 pages.*

* cited by examiner

*Primary Examiner*—Nadine Norton
*Assistant Examiner*—Lynette T. Umez-Eronini
(74) *Attorney, Agent, or Firm*—Manabu Kanesaka

(57) ABSTRACT

An etching liquid contains iodine, an iodine compound and alcohol as solute, and solvent such as water. The etching liquid etches a gold or gold alloy layer formed on the surface of a substrate for a semiconductor device or a liquid crystal device evenly. A plurality of gold or gold alloy columns is formed on the layer. The columns are etched scarcely by the etching liquid. The etching liquid etches the gold or gold alloy layer existing between the columns evenly. The etching liquid may further contain a surfactant.

10 Claims, No Drawings

ETCHING LIQUID

BACKGROUND OF THE INVENTION

The present invention relates to an etching liquid for etching gold or gold alloy, particularly an etching liquid which can be used for etching gold or gold alloy deposited on a substrate for a semiconductor device or a liquid crystal device.

(I) Gold and gold alloy are widely used as electrode wiring materials for semiconductor devices and liquid crystal display devices. The electrode wiring materials of gold or gold alloy can be processed finely by a wet etching method using an etching liquid.

Gold and gold alloy are conventionally wet-etched with an etching liquid such as an iodine etching liquid consisting of iodine, a salt of iodide and water; a bromine etching liquid consisting of bromine, a salt of bromide and water; and aqua regia (a mixture of nitric acid and hydrochloric acid). The iodine etching liquid is well reactable to gold and gold alloy, resulting in higher etching speed, and is easy to be handled.

A substrate having bump electrodes on which a semiconductor devices and other devices are installed consists of a base substrate of silicon, a primary metal layer formed on the silicon substrate, and a bump electrode(s) (a projecting electrode(s)) of gold or gold alloy formed on the primary metal layer. The primary metal layer has a base layer of Ti/W, Ti/N, Ti/Pt, etc. and a surface layer of gold or gold alloy formed on the base layer. The surface layer is formed so as to improve adhesion of the bump electrode to the base layer.

The substrate with the bump electrodes is produced as follows: firstly a 0.1 to 0.3 μm thick base layer is formed on the silicon substrate; a 0.1 to 1 μm thick surface layer of gold or gold alloy is formed thereon; a resist layer is plated by lithographic technique on the surface of an area of the surface layer other than that on which the bump electrode is to be formed; after that the bump electrodes are formed by depositing a gold or gold alloy layer having a predetermined thickness by a plating method on the surface of the surface layer on which the bump electrodes are to be formed. The bump electrodes project vertically toward the surface of the substrate.

Secondly, the resist layer is removed, so that the surface of the surface layer which has been covered with the resist layer is exposed to the air. The exposed surface layer is removed by wet etching, and the base layer which had been covered with the surface layer is further removed by wet etching. The above process produces the substrate having the silicone base substrate having thereon the fine bump electrodes which project in the vertical direction toward the surface of the base substrate.

The finished substrate further has the above-described metal base layer and the surface layer of gold or gold alloy between the silicon substrate and the bump electrode.

The surface layer should be equally removed by etching it and the bump electrodes should be etched as little as possible during etching the surface layer in order to form the bump electrodes with high precision in size.

However, the metal surface layer may not be removed fully when the surface layer is produced by a sputtering method according to the above-described conventional etching method. This is because as follows.

A rate of etching a sputtered gold or gold alloy layer is generally lower than that of a plated gold or gold alloy layer, which is probably due to the difference in the crystal structure of the layers. Since the surface layer of sputtered gold or gold alloy is etched at a lower etching rate than the bump electrodes of plated gold or gold alloy, the sputtered surface layer may not be removed completely and remain on the substrate as residues when the etching process is conducted such that the bump electrode is etched as little as possible.

The surface layer is especially apt to remain as residues in a portion between column-shaped bump electrodes which are arranged closed to each other, because the portion is in a valley-like shape and the etching liquid is difficult to be diffused to the bottom of the valley-like portion.

When much time is spent in etching the surface layer, the residues will disappear in the entire surface of the substrate including the valley-shaped portion. However, the etching process for a long time etches the bump electrodes in a large amount so that the bump electrodes lack the precision of the form, because the plated bump electrodes are etched at a higher rate than the sputtered surface layers.

Thus the bump electrode is not easy to be formed with high precision by the conventional etching liquid.

(II) Japanese patent publications S51-20976B, S49-123132A, S63-176483A and H6-333911A disclose an etching liquid for etching a minute electrode wiring pattern for semiconductor devices and liquid crystal display devices formed by using photolithographic technique on a substrate, which is added with an alcohol, surfactant and glycerin in order to weaken the surface tension of the etching liquid, whereby its affinity for both the gold and gold alloy and a photoresist film made of a synthetic resin can be improved, resulting in high etching accuracy.

However, none of the Japanese patent publications discloses an etching liquid added with additives such as an alcohol for etching the gold or gold alloy layer from which the photoresist has been removed.

The etching process of etching the gold or gold alloy layer with a mask of the photoresist differs from an etching process of finely processing the same type of metals on the substrate without using the mask wherein a bump electrode and a primary metal layer are etched. It should be noted that teaching of the etching liquid for the former process has not been applied to that for the latter one and no person skilled in the art would have thought to apply it to the latter.

SUMMARY OF THE INVENTION

An object of the present invention is to provide an etching liquid which is useful for wet etching in a process of fining a wiring of a substrate for a semiconductor device or a liquid crystal device.

More particularly, the object of the present invention is to provide an etching liquid which can etch equally a gold or gold alloy layer on a substrate for a semiconductor or a liquid crystal equally wherein gold or gold alloy columns are formed on the layer, and which etches scarcely the gold or gold alloy columns.

The etching liquid of the invention comprises as solute at least iodine, at least one iodine compound and alcohol. The etching liquid is for etching a gold or gold alloy layer formed on a substrate for a semiconductor or a liquid crystal. Plural gold or gold alloy columns are formed on the layer.

The etching liquid etches the layer equally while the liquid etches scarcely the columns. The etching liquid etches the layers equally and rapidly even at the bottom-like area between the columns close to each other.

DETAILED DESCRIPTION

The etching liquid of the invention is preferable for etching the layer formed thereon the gold or gold alloy columns having a square shape and having (I): an aspect ratio H/d of more than 1 wherein "H" is the height of the columns perpendicular to the surface of the substrate and "d" is the least distance between the adjacent columns, or (II): the least distance d of not more than 10 μm.

The etching liquid of the invention consists of solvent and solute. Water is preferably employed as the solvent. The solute includes at least iodine, at least one iodine compound and alcohol.

The content of iodine in the etching liquid is preferable to be 0.1 to 20% by weight, particularly 0.5 to 10% by weight, more particularly 1 to 8% by weight, most particularly 1.5 to 4% by weight but not limitative thereto.

The rate of etching gold or gold alloy increases as the content of iodine in the etching liquid becomes higher. Too high content of iodine in the etching liquid expands the difference between the etching rate of the gold or gold alloy layer among the columns and the etching rate of the columns. In this case, the evenness of the etched metal layers of gold or gold alloy, etc. can decrease. The etching rate decreases as the content of iodine becomes too low, so that too much time may be required in the etching process.

Iodine is difficult to dissolve in water but is relatively easy to dissolve in solutions of an iodide salt(s) such as potassium iodide, ammonium iodide, etc. The solution of an iodide salt(s) for use in desolution of iodine is preferable to contain at least one iodide salt in an amount as much as two to ten times moles of iodine to be dissolved into the solution. The solution of the iodide salt(s) for use in dissolution of iodine may contain one kind of iodide salt or two or more kinds of iodide salts.

The alcohol contained in the etching liquid is soluble in the solvent, and is preferably primary alcohol, more preferably primary alcohol having a number of carbon of 2 or more, particularly of 2 to 4, more particularly of 2 to 3. Examples of the primary alcohol are methanol, ethanol, 1-propanol, 1-butanol, etc. The etching liquid may contain one kind of alcohol or two or more kinds of alcohol.

A temperature of the etching liquid during the etching process is a room temperature or higher than it, preferably 20 to 50° C. The composition of the etching liquid may change during the etching process due to evaporation of the solvent and the solute. An alcohol having a low vapor pressure such as ethanol, 1-propanol, specifically 1-propanol is preferably employed in order to make less the change of the composition of the etching liquid.

Secondary alcohol and tertiary alcohol having a number of carbon atoms of 3 or more may decrease stability of the etching liquid due to a reaction of their hydroxyl groups with the iodide compounds to liberate iodine into the etching liquid.

The content of the alcohol in the etching liquid affects a surface tension of the etching liquid or diffusion characteristics of the etching liquid. The content also influences the etching liquid in depression of etching the gold or gold alloy columns. The content of the alcohol in the etching liquid is therefore determined preferably with reference to the size of the pattern of the gold or gold alloy columns on the substrate to be etched.

When the substrate fulfills at least one of the following conditions A and B, the etching liquid is preferable to have a surface tension of 50 mN/m or lower and the alcohol concentration thereof is preferably determined such that the etching liquid has such a value of the surface tension. The surface tension of the etching liquid is measured by a surface tension meter.

Condition A: The aspect ratio H/d is equal to or more than 1, specifically the gold or gold alloy columns have a square shape and the aspect ratio H/d is higher than 1;

Condition B: The distance between the columns d is 10 μm or smaller.

The etching liquid is improved in its diffusion characteristics and depression thereof in etching the gold or gold alloy columns, as its surface tension decreases. However, when the surface tension of the etching liquid is too low, the etching rate decreases to lower a through put. Thus, the surface tension is preferable to be 20 to 50 mN/m, particularly 25 to 45 mN/m.

The effect of depression of etching the gold or gold alloy columns due to the addition of the alcohol is thought to be affected by the form of iodine (or $I_2$ and $I_3^-$) existing in the etching liquid. The etching rate increases as the concentration of iodine increases provided that the alcohol concentration is constant. The iodine concentration is preferably determined after the alcohol concentration is determined such that the etching liquid has a predetermined surface tension in order to prepare the etching liquid having a desired etching rate.

The etching liquid may further contain a surfactant. The etching liquid added with the surfactant gives a surprising effect of depressing side etching. The side etching means a phenomenon in which the side surface of the gold or gold alloy layer under the columns is etched. The gold or gold alloy columns free from the side etching have such a high strength that damage to the columns is prevented when the columns are stressed perpendicularly to the surface of the substrate. In applications where the substrate having the columns free from the side etching is joined with another substrate such as a substrate for a liquid crystal display, the columns are prevented from being damaged, so that production yield increases.

The surfactant should not make the etching effect of the etching liquid worse and is preferable to be hardly oxidized by iodine in the etching liquid. The surfactant specified by the following general formula (1) is preferable because it is hard to be oxidized and destructured by iodine:

$$R\text{-}A\text{-}B\text{-}R' \tag{1}$$

in which:
R represents a hydrocarbon group which may have one or more substituents;
A represents a carbonyl group, a hydrocarbon group which may have at least one substituent, or at least one oxygen atom;
B represents NR" (wherein R" represents a hydrocarbon group which has at least one hydroxyl group,), NH or an oxygen atom;
R' represents a hydrocarbon group which has at least one hydroxyl group; and
R" may be either same as or different from R'.

The hydrocarbon group represented as R can be an alkyl group, an alkenyl group, an alkynyl group, or an aryl group, etc. The number of carbon atoms of the hydrocarbon group is preferably 3 to 20, more preferably 6 to 14 but not limitative thereto. The hydrocarbon group may be either in a saturated form or in an unsaturated form and may be either straight-chain or cyclic. The hydrocarbon group is preferably straight-chain, more preferably straight-chain and saturated.

The above hydrocarbon group represented as R may have a substituent group. Examples of the substituent group are a hydroxyl group, an ether group, an ammonium group, a halogen atom, a nitro group, a cyano group, a carbonyl group, an alkoxycarbonyl group, a carboxyl group, an aldehyde group, and a sulfonyl group, etc, but not limitative thereto.

In the above general formula(1), A represents a carbonyl group, a hydrocarbon group which may have a substituent, or an oxygen atom. Examples of the hydrocarbon group A are an alkylene group, and alkylidene group, etc. The hydrocarbon group can have the number of carbon atoms of 3 to 20, preferably 6 to 14, but not limitative thereto. The hydrocarbon group may be either saturated or unsaturated. The hydrocarbon group may be either straight-chain or cyclic. The hydrocarbon group is preferably straight-chain, more preferably straight-chain and saturated. The carbonyl group is preferably employed as A.

In the above general formula (1), R' represents a hydrocarbon group having at least one hydroxyl group which is bonded preferably to the end of the hydrocarbon group. The number of carbon atoms of the hydrocarbon group is preferably 1 to 5, more preferably 1 to 3, but not limitative thereto. The hydrocarbon group may be either saturated or unsaturated. The hydrocarbon group may be either straight-chain or cyclic. The hydrocarbon group is preferably straight-chain, more preferably straight-chain and saturated. The R' is preferably an alkanol group which is straight-chain and saturated and has a hydroxyl group at the end thereof.

In the above general formula (1), B represents NR" wherein the R" represents a hydrocarbon group having at least one hydroxyl group, NH or an oxygen atm. R" may be the same as R' or may differ from R'. The B is preferably NR" or NH, and more preferably NR" in which R" is the same as R'.

The surfactant specified by the above formula(1) is preferably an alkanolamide type wherein the A is a carbonyl group and the B is NR". The alkanolamide type is stable in the etching liquid and give a very good effect of inhibiting side etching on the gold or gold alloy layer. The alkanolamide type is difficult to be absorbed by the substrate and remains little on the etched surface of the substrate. The etching liquid contains the surfactant preferably in an amount of 5 wt. % or less, preferably 0.001 wt. % (10 ppm) to 5 wt. %, more preferably 0.01 wt. % (100 ppm) to 1 wt. %, yet more preferably 0.05 wt. % (500 ppm) to 1 wt. %, while the invention is not limited thereto. The surfactant of too low concentration may not give sufficient effects, while the surfactant of too high concentration may saturate the effects. The etching liquid may be bubbled when the content of the surfactant is too high.

The etching liquid is used for etching a substrate for a semiconductor device or a liquid crystal device which has a gold or gold alloy layer thereon and a plurality of fine gold or gold alloy columns (bump electrodes) on the gold or gold alloy layer. The substrate includes a silicon wafer used for production of a semiconductor device, a silicon wafer in a process of producing a semiconductor device, and a substrate on which a semiconductor device or a liquid crystal displaying device is installed, and the like.

The etching liquid of the invention etches a fine electrode wiring pattern on a substrate including above with high precision.

Since the etching liquid of the invention etches a substrate for a semiconductor device or liquid crystal, it should have a high purity and is preferably prepared from high-purity chemicals which contain metal impurity of less than 1 ppm by weight. The lower the content of each impurity is, the more preferable the chemicals are.

Fine particles existing in the etching liquid is preferably removed such that the number of the fine particles having a diameter of 0.5 μm or more becomes 1000 or less per 1 ml of the etching liquid since the particles may disturb the etching liquid to etch evenly the substrate having a fine pattern. The particles can be removed by filtering the prepared etching liquid with a microfilter. The etching liquid can be filtered either in a one-pass system or in a circulation system. The circular system is preferable to the one-pass system because the former is superior in efficiency of removing particles to the latter.

The microfilter preferably has pores having a diameter of 0.2 μm or less and may consist of high-density polyethylene, fluororesin such as polytetrafluoroethylene, and the like.

The etching liquid of the invention is employed in various kinds of wet etching processes. An immersion etching process and a spray etching process are well known and the etching liquid can be employed in either process. The immersion etching process is preferably employed because the composition of the etching liquid hardly changes due to the evaporation thereof during the process. In case of the immersion etching process, a substrate to be etched is immersed in the etching liquid within a batch wherein the etching liquid is circulated. The substrate is preferably swung in the etching liquid, so that the etching liquid is applied to the finely formed portion of the pattern on the substrate evenly. In stead thereof the substrate may be left at rest during the etching process.

The etching liquid is etched in the etching liquid preferably at a room temperature or a raised temperature, more preferably 25° C. to 70° C., yet more preferably 25° C. to 50° C., so that the etching rate increases and the etching liquid evaporates little while the invention is not limitative thereto.

The shape and arrangement of the fine projections and depressions of gold or gold alloy on the surface of a substrate to be etched such as for a semiconductor etc. are not limited and may be adapted to various configurations for various applications. The substrate may be a silicon wafer which has thereon a semiconductor device, etc. and which has a base layer consisting of a metal or alloy such as Ti/W, Ti/N, Ti/Pt of a thickness of about 0.1 to 0.3 μm and a surface layer of gold or gold alloy of a thickness of about 0.1 to 1 μm formed thereon by sputtering, and gold or gold alloy columns having a height H of 5 to 25 μm, perpendicularly to the substrate arranged on the upper layer such that the distance d between the columns is 2 to 20 μm, and thus the aspect ratio H/d is 0.25 to 12.5. But the substrate is not limited to the above.

The etching liquid of the invention is very effective in etching the substrate having gold or gold alloy columns having a square shape and an aspect ratio H/d higher than 1. Specifically, it is effective in etching the substrate having fine projections in which the least distance d between the adjacent gold or gold alloy columns is 10 μm or smaller. That is, the etching liquid of the invention etches the gold or gold alloy layer on the substrate effectively while it etches scarcely gold or gold alloy columns on the layer without changing the shape of columns, whereby the pattern with high precision is produced.

EXAMPLES AND COMPARATIVE EXAMPLES

Without further elaboration, it is believed that one skilled in the art, using the preceding description, can utilize the present invention to its fullest extent. The following embodiments are, therefore, to be construed as merely illustrative, and not limitative in any way whatsoever, of the remainder of the disclosure.

The present invention is further illustrated by the following Examples.

A mother substrate for etching tests was prepared by forming on a silicon wafer a titanium/tungsten thin layer having a thickness of about 0.2 μm by sputtering, forming on the layer a gold thin layer having a thickness of about 0.4 μm by sputtering, and forming a plurality of gold columns (bump electrodes) by plating on the gold layer. The gold columns had a square shape and a height H of 10 μm perpendicular to the substrate, and were arranged such that the distance d therebetween is 7.7 μm and the aspect ratio is about 1.3.

The mother substrate was cut into pieces having a width of about 15 mm and a length of about 50 mm to prepare a sample substrate to be etched.

Examples 1-5, Comparative Examples 1 and 2

Etching liquids having a composition and a surface tension shown in Table 1 in which the other part of each composition was water were prepared, respectively. The surface tension of each etching liquid was measured by a surface tension meter (A-3 Type of Kyowa CBVP System Surface Tension Meter, commercially available from Kyowa Science Ltd.) at a room temperature.

Each of the chemicals used for preparing the etching liquids had a purity as high as 99.9% or higher and contained metal impurities of 0.1 to 2.0 ppm by weight. The number of particles have a diameter of 0.5 μm or larger contained in each etching liquid was less than 100 per 1 ml.

TABLE 1

| | iodine [wt. %] | potassium iodide [wt. %] | 1-propanol [wt. %] | ethanol [wt. %] | surface tension [m/Nm] |
|---|---|---|---|---|---|
| Examples | | | | | |
| 1 | 1.9 | 7.3 | 33.2 | 0 | 27.7 |
| 2 | 2.85 | 11.0 | 33.2 | 0 | 27.9 |
| 3 | 1.9 | 7.3 | 0 | 33.2 | 32.2 |
| 4 | 2.85 | 11.0 | 0 | 33.2 | 32.9 |
| 5 | 1.9 | 7.3 | 0 | 10.0 | 47.7 |
| Comparative Examples | | | | | |
| 1 | 1.9 | 7.3 | 0 | 0 | 65.0 |
| 2 | 2.85 | 11.0 | 0 | 0 | 66.0 |

Each etching liquid of 150 g was poured into a beaker having a capacity of 200 ml and kept at 30° C. The above sample substrate was immersed in each etching liquid for a predetermined time during which it is swung sideways and up and down. After that the substrate was taken out of the etching liquid and was rinsed with ultrapure water (Milli Q-SP, commercially available from Nippon Millipolya Ltd.) for one minute. And then the substrate was dried with clean air.

The surface of the substrate was observed at its condition and configuration of the surface of each substrate were observed by a laser microscope (VK-8500, available from Keyence Ltd.). The etching rate of the portion of the gold layer between the gold columns, the etching rate of the other portion of the gold layer, and the etching rate of the gold columns were detected from changes with time of residues of the gold layer and the height of the gold columns.

The ratio of the etching rate of the gold column to the etching rate of the portion of the gold layer between the columns was also detected.

The results are shown in Table 2.

TABLE 2

| | etching rate of gold layer formed by sputtering [Å/min.] | etching rate of golod column formed by plating [Å/min.] | etching rate of gold layer formed by sputtering between gold columns formed by plating [Å/min.] | ratio of etching rates |
|---|---|---|---|---|
| Examples | | | | |
| 1 | 1000 | 1980 | 667 | 2.97 |
| 2 | 1000 | 3025 | 1000 | 3.03 |
| 3 | 1333 | 4725 | 1000 | 4.73 |
| 4 | 2000 | 9000 | 2000 | 4.50 |
| 5 | 4000 | 8000 | 1000 | 8.00 |
| Comparative Examples | | | | |
| 1 | 4000 | 14500 | 1600 | 9.06 |
| 2 | 4000 | 9800 | 500 | 19.60 |

Table 2 shows that the etching liquids of Examples 1 through 5 etch the substrate evenly such that the gold columns were etched to the objective form. Particularly, the etching liquids of Examples 1 through 4 to each of which the primary alcohol was added such that the surface tension thereof became 45 mN/m or lower were improved in ability to get into the narrow portions between the columns, and reduced the difference in etching rate between the rate of etching the plated gold columns reactively and the rate of etching the sputtered gold layer between the gold columns by the diffusion of the etching liquid.

On the contrary, in Comparative Examples 1 and 2, all the gold layer between the gold columns was observed to be etched unevenly. After the gold layer between the gold columns was etched out, all the columns were found to be deformed through the observation of their shapes. This means that the etching liquids of the Comparative Examples 1 and 2 did not etch the substrates evenly.

In Example 2 and Comparative Example 2, the condition of side etching occurred in the gold layer directly under the gold columns was observed, respectively, after the etching process. The substrates etched were cut across the surface and the gold layer in which the side etching occurred was observed by a scanning electron microscope (SEM: JSM-6320F, available from Nippon Electron Ltd.). The thickness of the gold layer and the length of progress of side etching were detected from SEM photographs, and the ratio of the length of side etching to the thickness of the gold layer was calculated. The ratio was employed as barometer of the side etching. The side etching progresses more slowly as the ratio becomes smaller. The results are shown in Table 3.

Example 6

An etching process was conducted in the same manner as that in Example 2 except that a surfactant of a type of fatty alkanolamide (N-diethanolamide having saturated alkyl chain in which the number of carbon atoms is 9; $C_9H_{19}CO-N(OC_2H_5)_2$) was added such that the concentration thereof became 500 ppm. The condition of side etching was observed to evaluate the etching liquid in the same manner as that in Example 2. The results are shown in Table 3.

TABLE 3

| | composition of etching liquid | | | | estimation barometer of side etching (ratio of length of side etching to thickness of gold layer formed by sputtering) |
|---|---|---|---|---|---|
| | iodine [wt. %] | potassium iodide [wt. %] | 1-propanol [wt. %] | surfactant [wt. ppm] | |
| Example 2 | 2.85 | 11 | 33.2 | 0 | 1.8 |
| Example 6 | 2.85 | 11 | 33.2 | 500 | 0.6 |
| Comparative Example 2 | 2.85 | 11 | 0 | 0 | 7 |

Table 3 shows that the side etching progressed slower in Examples 2 and 6 than in Comparative Example 2, and the etching liquid of Example 6 in which the surfactant was added produced scarcely the side etching.

As described above, the etching liquid of the invention etches evenly the gold or gold alloy layer on the substrate for a semiconductor device or a liquid crystal device having the gold or gold alloy layer and the gold or gold alloy columns on the layer, and the gold or gold alloy columns are etched scarcely.

The etching liquid of the invention etches scarcely the gold or gold alloy column to be left as an electrode or a wiring and etches the gold or gold alloy layer on the substrate evenly, so that it realizes fine process of the gold or gold alloy wiring and the gold or gold alloy electrode layer on the substrate for a semiconductor or a liquid crystal with high precision.

The foregoing is considered illustrative only of the principles of the invention. Further, since numerous modifications and changes will readily occur to those skilled in the art, it is not desired to limit the invention to the exact construction and operation shown and described. Accordingly, all suitable modifications and equivalents may be resorted to that fall within the scope of the invention and the appended claims.

What is claimed is:

1. An etching liquid for etching a gold or gold alloy layer formed on a surface of a substrate for a semiconductor device or a liquid crystal device and having plural gold or gold alloy columns on said layer, comprising:
   a solvent, a solute containing at least iodine, at least one iodine compound and alcohol, and a surfactant,
   wherein said surfactant is specified by the following general formula (1):

R-A-B-R'  (1);

in which:
   R represents a hydrocarbon group which may have at least one substituent;
   A represents one of a carbonyl group, a hydrocarbon group which may have at least one substituent, and an oxygen atom;
   B represents NR" wherein R" represents one of a hydrocarbon group which has at least one hydroxyl group, NH, and an oxygen atom;
   R' represents a hydrocarbon group which has at least one hydroxyl group; and R" is same as or different from R'.

2. An etching liquid as claimed in claim 1, wherein said alcohol is primary alcohol.

3. An etching liquid as claimed in claim 2, wherein said alcohol is primary alcohol and has the number of carbon atoms of at least 2.

4. An etching liquid as claimed in claim 1, wherein said iodine is contained in an amount of 0.5 to 10% by weight.

5. An etching liquid as claimed in claim 1, wherein said etching liquid has a surface tension of 45 mN/m or lower.

6. An etching liquid as claimed in claim 1, wherein said iodine compound is an iodide salt.

7. An etching liquid as claimed in claim 6, wherein the iodine salt is at least one of potassium iodide and ammonium iodide.

8. An etching liquid as claimed in claim 1, wherein said surfactant is included in an amount of l0ppm to 5% by weight.

9. An etching liquid as claimed in claim 1, wherein the solvent is water.

10. An etching liquid as claimed in claim 1, wherein said A is a carbonyl group and said B is an alkanolamide.

* * * * *